United States Patent [19]

Richmond et al.

[11] 4,149,123
[45] Apr. 10, 1979

[54] ATTENUATOR

[75] Inventors: Martin R. Richmond, Lexington, Mass.; Alfred J. Cann, Wilton, N.H.

[73] Assignee: Sanders Associates, Inc., Nashua, N.H.

[21] Appl. No.: 920,928

[22] Filed: Jun. 30, 1978

Related U.S. Application Data

[63] Continuation of Ser. No. 797,650, May 16, 1977, abandoned.

[51] Int. Cl.² .................... H03K 9/02; H03K 5/08
[52] U.S. Cl. .................... 328/168; 333/81 R; 332/31 R; 328/55; 328/158; 307/240; 307/232
[58] Field of Search ............. 328/168, 169, 55, 158; 333/81 R; 332/31 R, 31 T; 329/110, 112; 307/232, 295, 240

[56] References Cited

U.S. PATENT DOCUMENTS

| | | | |
|---|---|---|---|
| 3,181,074 | 4/1965 | Cotterill | 328/168 X |
| 3,201,700 | 8/1965 | Pasquier et al. | 328/55 |
| 3,260,966 | 7/1966 | Murray | 332/31 T |
| 3,348,145 | 10/1967 | Erath | 307/232 X |
| 3,351,863 | 11/1967 | Riemens | 333/81 R |
| 3,363,188 | 1/1968 | Gardere | 328/168 X |
| 3,624,560 | 11/1971 | Milton | 332/31 R |
| 3,662,290 | 5/1972 | Elliott | 328/168 X |
| 3,898,593 | 8/1975 | Qureshi | 333/81 R |
| 3,973,223 | 8/1976 | Uchiyama | 332/31 T |

Primary Examiner—John S. Heyman
Attorney, Agent, or Firm—Louis Etlinger; Richard I. Seligman

[57] ABSTRACT

Attenuation of a signal is achieved by biphase modulating the signal with an asymmetrical duty factor rectangular wave. In one embodiment of the invention an input signal is applied to a phase reversal switch having as its second input thereto an asymmetrical duty factor rectangular wave.

10 Claims, 6 Drawing Figures

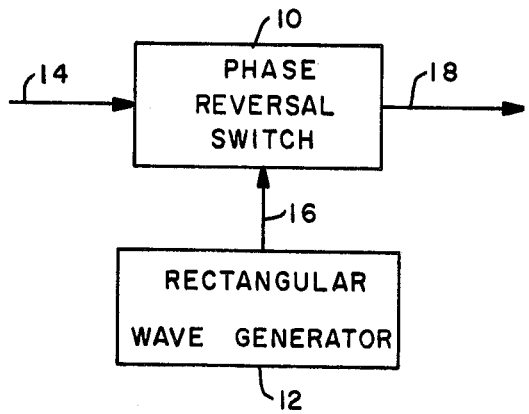
FIG. 1
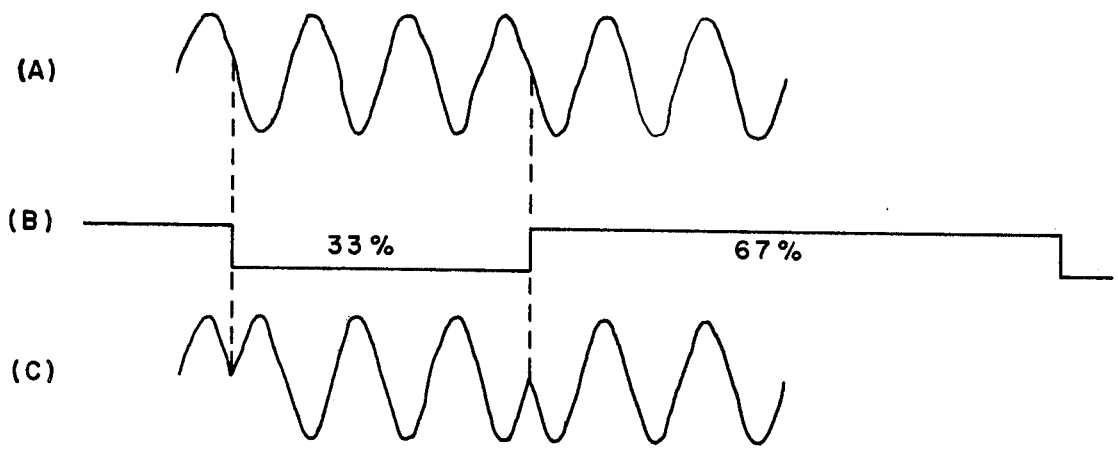
FIG. 2
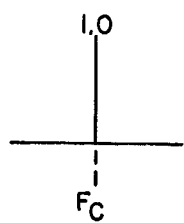 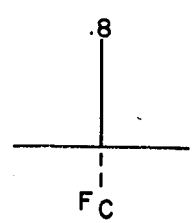 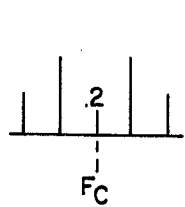 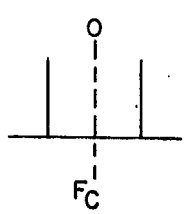
FIG.3A  FIG.3B  FIG.3C  FIG.3D

ATTENUATOR

This is a continuation of application Ser. No. 797,650, filed May 16, 1977 now abandoned.

BACKGROUND OF THE INVENTION

This invention relates to attenuators and more particularly to attenuators employing phase modulation.

There are many applications which require attenuators of a signal. One class of applications are transmitters employing high gain stages of amplification such as traveling wave tubes operating in saturation or nonlinear amplification components and requiring that a continuous wave (CW) signal be transmitted at low and high power levels. To transmit at low power the CW signal must first be attenuated prior to being applied to the amplification stage. Because of the saturated operation of the amplification stage or the nonlinearity thereof it cannot be determined for certain how much attenuation of the signal prior to amplification will produce the desired attenuation of the output from the amplification stage. Accordingly, other means must be used to insure correlation between the amount of attenuation of the input signal and that of the amplified signal. Typically, automatic gain control (AGC) is employed. This, however, is undesirable as the AGC circuit increases complexity, size, expense, power requirements, etc., of the overall system. Also, the level detector of the AGC circuit contributes to inaccuracy by its variation with frequency and temperature.

Furthermore, typical attenuators employed in such a system occasion other problems. If diode attenuators are used then all the problems generally associated with diodes come into being, such as their switching speed and their dependence on temperature, frequency and the like. An alternate to the diode attenuators is the electron beam switching modulator (EBSM) tube, a TWT whose gain can be varied by a control grid voltage. This solves many of the problems associated with diodes, however, these tubes are expensive, bulky and unreliable in that they have the high failure rate associated with tubes in general and with high voltage supplies required to operate such tubes.

One method of avoiding the problem of nonlinear attenuation for the amplification stage without using AGC is to always transmit full power or no power, during the attenuated portion of the signal, by switching the signal off and on at a rate much higher than the bandwidth of any receiver to receive the signal. However, this substitution of duty factor for attenuation has many problems of its own in that it requires extremely fast diode switches. In one example if the receiver has an i.f. bandwidth of 10 megahertz then a switching rate of at least 40 megahertz would be required to make the effect of the switching undistinguishable from a true attenuation by the receiver. And if a 20 dB attenuation is required, then a pulse width of 2.5ns must be produced. This means that the rise and fall times of the switching pulses must be on the order of less than one nanosecond.

SUMMARY OF THE INVENTION

Accordingly, it is an object of this invention to provide an improved attenuator.

It is another object of this invention to provide an improved attenuator which does not require automatic gain control for providing precise attenuation.

Briefly, attenuation of a CW signal is provided by biphase modulating the CW signal at a high rate and with a duty factor related to the degree of attenuation desired. The CW signal to be attenuated is applied to a phase reversal switch which is operated at an asymmetrical duty factor such that the average output amplitude is proportional to the difference of the two halves of the asymmetrical switching wave. The output of the phase reversal switch will have a spectral content including a center line equal to the input frequency and many sidebands spaced by the switching rate. The sidebands present no problem since the intended receivers are narrow band and will reject the sidebands.

BRIEF DESCRIPTION OF THE DRAWINGS

The above-mentioned and other features and objects of this invention will become more apparent by reference to the following description taken in conjunction with the accompanying drawings, in which:

FIG. 1 is a block diagram of one embodiment of the invention;

FIG. 2 is a diagram of a number of typical waveforms illustrating operation of the embodiment of FIG. 1;

FIG. 3 is a diagram illustrating change in spectral content of the output of the embodiment of FIG. 1 depending on the inputs thereto;

DESCRIPTION OF PREFERRED EMBODIMENTS

Figure 4:
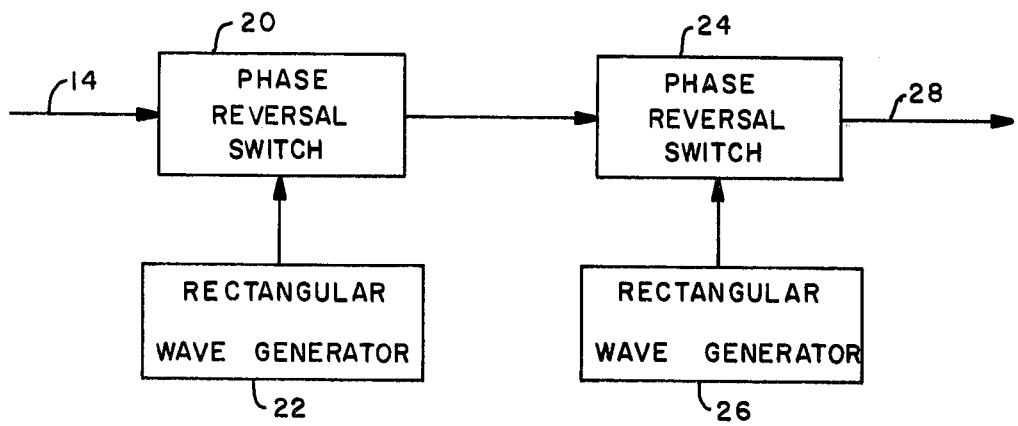
FIG. 4 is a block diagram of another embodiment of the invention.

Referring now to FIG. 1 of the drawings, there is illustrated thereby an attenuator according to the invention which comprises a phase reversal switch 10 which is switched by the output of a rectangular wave generator 12. A typical signal to be attenuated is illustrated by waveform (A) of FIG. 2 of the drawings. This continuous wave signal (A) is applied at input 14 to the phase reversal switch 10. A typical modulating waveform generated by rectangular wave generator 12 and applied to the phase reversal switch 10 at an input 16 is illustrated by waveform (B) of FIG. 2 of the drawings. This modulating waveform has an asymmetrical duty cycle.

For the input waveform (A) and modulating waveform (B) the output of phase reversal switch 10 will appear as illustrated in waveform (C) of FIG. 2. It is seen that each time the polarity of modulating waveform (B) changes, the phase of the signal at output 18 changes. For the waveforms illustrated in FIG. 2 of the drawings the attenuation ratio will be the difference between the two portions of the rectangular wave (B), namely, the difference in this example between 67% and 33%, or an attenuation ratio of 0.34. That is, the center frequency of the spectrum will have an amplitude of 34% of the input wave (A).

FIG. 3 comprises a number of spectrum diagrams illustrating the operation of the invention. The spectrum diagram (A) illustrates the spectrum of the waveform (A) of FIG. 2, namely, a center frequency having a normalized amplitude of one. Diagram (B) of FIG. 3 illustrates a typical spectrum when the asymmetrical wave from rectangular wave generator 12 is constituted so that one portion of the wave is 90% and the other portion is 10%. Thus, the center frequency $f_c$ of the spectrum will have an amplitude which is the difference of 90% and 10%, or 0.8 of the input wave 14. In diagram (C), the spectrum illustrates a case wherein the relationship between the two halves of the rectangular wave are 60-40 such that the center frequency is down to 0.2 or 20% of the original amplitude and in this case, the sidebands will probably have amplitudes greater than the center frequency. In diagram (D) of FIG. 3 there is no output at the center frequency $f_c$ indicating that the modulating waveform from rectangular wave generator 12 is symmetrical (50% duty factor).

Accordingly, by simply employing a phase reversal switch and operating the switch from a simple rectangular wave generator using an asymmetrical rectangular wave, reliable attenuation is achieved simply and inexpensively. This circuit has many advantages over that of other attenuation methods since the output of any amplification stage following the phase reversal switch operates fully on at all times and, thus, no AGC circuit is required. Since the switch is always fully in one state or the other except during the switching time, its performance is not materially affected by temperature changes and because of hard switching, the switch loss changes only negligibly with frequency. Since this type of switch can be followed by any number of stages of gain it can be placed at a low level point in the system thus only requires a low power device. The attenuation depends only on the duty factor and this is a quantity which can be made quite stable and which can be set precisely.

The attenuator consists of only a phase reversal switch driven by a high frequency rectangular wave of specified duty factor. Representative phase reversal switches which may be employed are balanced mixers and balances modulators.

The theory of operation of this type of attenuator is derived from the aforementioned attenuation method employing on/off switching as seen below.

If a CW signal is chopped at a rate which is high compared with the receiver bandwidth, the effective voltage in the receiver is reduced by the duty factor, d.

$$V_1 = d$$

If another CW signal, 180° out of phase with the first, is chopped in such a way that it fills the gaps in the first signal, its effective voltage is proportional to its duty factor, 1-d.

$$V_2 = 1 - d$$

By superposition these two signals subtract so that the net effective voltage is $$V_0 = 1 - 2d$$

and the effective power is $$P_0 = (1 = 2d)^2$$

To achieve high attenuation with high accuracy employing the attenuator of FIG. 1 is sometimes difficult, particularly at high frequencies, since there will be some leakage in the phase reversal switch and as this leakage varies in phase it may add to or subtract from the desired signal. To reduce these problems the circuit illustrated in FIG. 4 may be employed wherein the input signal 14 is applied to a first phase reversal switch 20 having as a second input thereto the output from a rectangular wave generator 22. The output of phase reversal switch 20 is applied to a second phase reversal switch 24 cascaded with the first which has as a second input thereto the output from a second rectangular wave generator 26. In this embodiment the rectangular waves from the generators 22 and 24 are symmetrical as contrasted to the asymmetrical waves used in the embodiment of FIG. 1, however, the relative phase of the two rectangular waves from generators 22 and 24 is adjusted to provide the desired attenuation.

Figure 5:
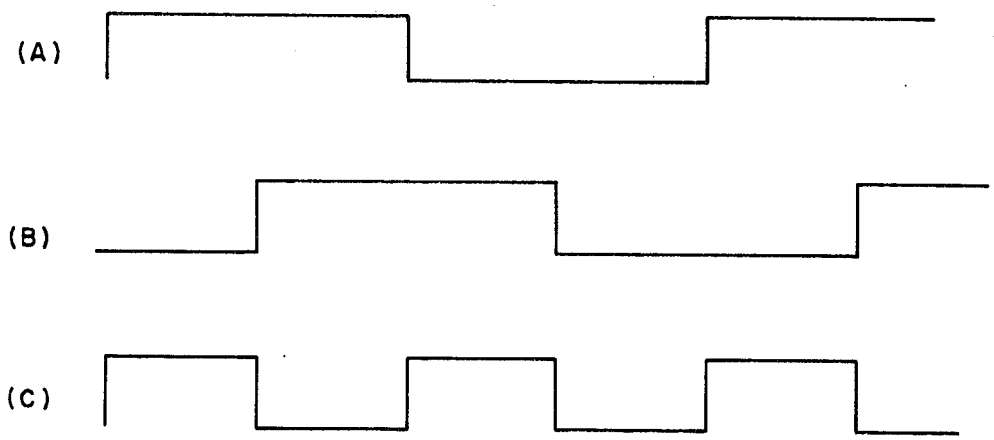
FIG. 5 is a diagram of a number of typical waveforms illustrating operation of the embodiment of FIG. 4.

This is shown in FIG. 5 wherein waveform (A) is a representative waveform from rectangular wave generator 22 and waveform (B) is a representative waveform from rectangular wave generator 24. It is seen that the waveforms (A) and (B) are not in phase. The resultant of the two rectangular waves is shown by waveform (C) of FIG. 5.

Figure 6:
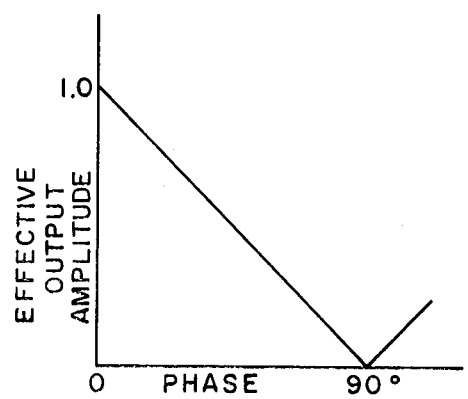
FIG. 6 is a diagram illustrating the attenuation characteristics of the embodiment of FIG. 4.

In this embodiment, when the two rectangular waves are in phase the input signal 14 will be received at the output 28 of phase reversal switch 24 substantially unmodified and when the waveforms (A) and (B) are 90° out of phase the output will be phase reversed with 50% duty factor. The change in (center frequency) output at 28 is linear with the change in phase between waveforms (A) and (B) as illustrated in FIG. 6. Thus, at a 45° phase shift between the modulating waves (A) and (B), the effective output at 28 will be one half the input voltage.

In this embodiment any leakage from the first stage is chopped by the second stage and, therefore, the resulting isolation is twice as good (in dB) as for one stage. In this embodiment the individual squarewave frequencies need only be, for example, 20 MHz to produce a 40 MHz output rate.

Although phase shift of two square waves has been discussed, it is obviously possible to use duty factor variation of one of them instead.

To achieve even greater accuracies more than two stages may be employed in the manner shown in FIG. 4. For example, three phase reversal switches and their modulating rectangular waves may be employed. For such an embodiment the first two modulating waves would be, as an example, 90° apart in phase and the third shifted an amount proportional to the amount of attenuation desired. However, this is only exemplary and other phase differences between the modulating waves may be employed, as may duty factor variation.

In the case of both single and multiple-stage devices it should be noted that the effective isolation in the system is improved, by limiting in the subsequent amplifiers, over that which would be measured at the output of the biphase modulator itself. This comes about because any amplitude unbalance between the two states of a modulator would be reduced or removed by limiting. Thus, only that leakage which is due to phase error, i.e., not shifting precisely 180°, would remain.

While the present invention has been described for simplicity for attenuating CW signals, the principles thereof apply to any signal such as AM, FM, PM, PULSE and combinations thereof and to frequencies from d.c. to light. Thus, it is to be understood that the embodiments shown are illustrative only, and that many variations and modifications may be made without departing from the principles of the invention herein disclosed and defined by the appended claims.

We claim:

1. Apparatus for attenuating a signal within a particular bandwidth, comprising:
   a phase reversal switch having first and second inputs and an output;
   means for applying an input signal to said first input of said phase reversal switch; and
   means for applying an asymmetrical rectangular wave having a low frequency relative to said signal but greater than said bandwidth to the second input of said phase reversal switch such that said asymmetrical rectangular wave occasions phase reversal of the input signal causing a power reduction in the center line of the output spectrum at the frequency of the input signal and whereby variable attenuation can be achieved by varying the duty factor of the asymmetrical rectangular wave.

2. Apparatus as defined in claim 1, wherein said phase reversal switch is a balanced mixer.

3. Apparatus as defined in claim 1, wherein said phase reversal switch is a balanced modulator.

4. Apparatus for attenuating a signal within a particular bandwidth, comprising:
   a plurality of cascaded phase reversal switches;
   means for applying an input signal to said plurality of cascaded phase reversal switches; and
   means for applying rectangular waves to each of said phase reversal switches of a low frequency relative to said signal but greater than said bandwidth, the phase relationship of said rectangular waves being adjusted to control the attenuation of said input signal.

5. Apparatus as defined in claim 4, wherein said phase reversal switches are balanced mixers.

6. Apparatus as defined in claim 4, wherein said phase reversal switches are balanced modulators.

7. A method of attenuating a signal within a particular bandwidth comprising the steps of:
   applying the signal to a phase reversal switching circuit; and
   changing the phase of the signal with an asymmetrical duty factor wave having a low frequency relative to said signal but greater than said bandwidth such that variable attenuation can be achieved by varying the duty factor.

8. Apparatus for attenuating a signal within a particular bandwidth comprising:
   a plurality of cascaded phase reversal switches;
   means for applying an input signal to said plurality of cascaded phase reversal switches; and
   means for applying rectangular waves to each of said phase reversal switches of a low frequency relative to said signal but greater than said bandwidth, at least one of which has an asymmetrical duty factor.

9. Apparatus as defined in claim 8, wherein said phase reversal switches are balanced mixers.

10. Apparatus as defined in claim 8, wherein said phase reversal switches are balanced modulators.

* * * * *